(12) United States Patent
Watanabe et al.

(10) Patent No.: US 10,157,932 B2
(45) Date of Patent: Dec. 18, 2018

(54) SEMICONDUCTOR DEVICE AND PRODUCTION METHOD THEREOF

(71) Applicant: SEIKO EPSON CORPORATION, Tokyo (JP)

(72) Inventors: Kunio Watanabe, Sakata (JP); Masaki Okuyama, Tsuruoka (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/668,139

(22) Filed: Aug. 3, 2017

(65) Prior Publication Data

US 2018/0047745 A1  Feb. 15, 2018

(30) Foreign Application Priority Data

Aug. 10, 2016 (JP) ................ 2016-157428

(51) Int. Cl.
| | |
|---|---|
| *H01L 27/11568* | (2017.01) |
| *H01L 29/792* | (2006.01) |
| *H01L 21/266* | (2006.01) |
| *H01L 29/66* | (2006.01) |
| *H01L 21/311* | (2006.01) |
| *H01L 29/51* | (2006.01) |

(Continued)

(52) U.S. Cl.
CPC ...... *H01L 27/11568* (2013.01); *H01L 21/266* (2013.01); *H01L 21/28282* (2013.01); *H01L 21/31144* (2013.01); *H01L 27/11573* (2013.01); *H01L 29/513* (2013.01); *H01L 29/518* (2013.01); *H01L 29/66833* (2013.01); *H01L 29/792* (2013.01); *H01L 21/0217* (2013.01); *H01L 21/02164* (2013.01); *H01L 21/26513* (2013.01)

(58) Field of Classification Search
CPC ............ H01L 27/11568; H01L 21/266; H01L 21/28282; H01L 21/31144; H01L 21/02164; H01L 21/0217; H01L 21/26513; H01L 29/513; H01L 29/518; H01L 29/66833; H01L 29/792
USPC .......................................... 257/324; 438/763
See application file for complete search history.

(56) References Cited

U.S. PATENT DOCUMENTS 9,461,138 B2    10/2016  Fukumoto et al.
2008/0293207 A1*  11/2008  Koutny, Jr. ..... H01L 21/823412
                                                      438/306
2015/0008500 A1*  1/2015  Fukumoto ......... H01L 21/28282
                                                      257/314

FOREIGN PATENT DOCUMENTS

JP    2007-227585 A    9/2007
JP    2009-252876 A    10/2009

(Continued)

*Primary Examiner* — Cuong Q Nguyen
*Assistant Examiner* — Tong-Ho Kim
(74) *Attorney, Agent, or Firm* — Oliff PLC

(57) ABSTRACT

A semiconductor device includes: a memory transistor including a first silicon oxide film, a first silicon nitride film, a second silicon oxide film, and a first gate electrode that are disposed in sequence on a substrate; and a MOS transistor including a third silicon oxide film and a second gate electrode that are disposed in sequence on the substrate. The memory transistor has a side wall including an extending portion of the first silicon oxide film, a second silicon nitride film that is in contact with the first silicon nitride film, and a fourth silicon oxide film that are disposed in sequence on the substrate, and the MOS transistor has a side wall including a fifth silicon oxide film that is disposed on the substrate.

14 Claims, 8 Drawing Sheets

(51) Int. Cl.
*H01L 21/28* (2006.01)
*H01L 27/11573* (2017.01)
*H01L 21/02* (2006.01)
*H01L 21/265* (2006.01)

(56) References Cited

FOREIGN PATENT DOCUMENTS

JP     2011-96727 A    5/2011
JP     2013-179122 A    9/2013

\* cited by examiner

SEMICONDUCTOR DEVICE AND PRODUCTION METHOD THEREOF

BACKGROUND

This patent application claims the benefit of Japanese Patent Application No. 2016-157428, filed on Aug. 10, 2016. The content of the aforementioned application is incorporated herein by reference in its entirety.

1. Technical Field

The present invention relates to a semiconductor device incorporating an electrically rewritable non-volatile memory such as an EEPROM (Electrically Erasable Programmable Read-Only Memory) or a flash memory, and a production method thereof.

2. Related Art

It is known that there are two types of electrically rewritable non-volatile memories: a floating gate type memory; and a charge trap type memory. The floating gate type memory is configured such that a floating gate electrode is provided between two gate insulating films of a memory transistor, electric charges are accumulated in the floating gate electrode, and data is thereby stored.

On the other hand, the charge trap type memory is configured such that a gate insulating film of a memory transistor has a stack structure (ONO structure) including a silicon oxide film, a silicon nitride film and a silicon oxide film, and electric charges are accumulated in discrete traps that are present in the silicon nitride film near the interface between the silicon nitride film and the silicon oxide film (tunnel film) that is provided on the silicon substrate side. The threshold voltage of the memory transistor thereby changes, and thus data can be stored. Such a memory transistor is also called MONOS (Metal Oxide Nitride Oxide Semiconductor) or SONOS (Silicon Oxide Nitride Oxide Semiconductor).

In the case of the charge trap type memory, because electric charges are accumulated in the silicon nitride film that is an insulating film, even if the insulation property of the tunnel film drops to a level slightly lower than that of the floating gate type memory, it does not become a problem. Also, the thickness of the tunnel film can be reduced, and thus a data write voltage can be lowered. However, there is a problem in that if the production process for producing a semiconductor device ends with the electric charges accumulated during the production process being trapped in the silicon nitride film, the threshold voltage varies as compared to a state in which electric charges are not trapped in the silicon nitride film.

As a related art, JP-A-2013-179122 (paragraphs [0013] to [0014] and [0037] to [0040], and FIG. 2, hereinafter referred to as Patent Document 1) discloses a non-volatile semiconductor memory that solves the above-described problem. A non-volatile semiconductor memory 200 disclosed in FIG. 2 of Patent Document 1 includes a silicon substrate 12, a first silicon oxide film 20 stacked on the silicon substrate 12, a first silicon nitride film 21 stacked on the first silicon oxide film 20, a second silicon oxide film 22 stacked on the first silicon nitride film 21, a third silicon oxide film 30 that is provided on the silicon substrate 12 and is adjacent to the first silicon oxide film 20, and a second silicon nitride film 23 having a first portion that is in contact with the first silicon nitride film 21 and a second portion that is in contact with the silicon substrate 12 via the third silicon oxide film 30.

With this configuration, the second silicon nitride film 23 is in contact with the first silicon nitride film 21 and is also in contact with the silicon substrate 12 via the third silicon oxide film 30, and thus excess electric charges (process charging) trapped in the first silicon nitride film 21 during the production process can be diffused into the silicon substrate 12 via the second silicon nitride film 23 and the third silicon oxide film 30 in another production process. Accordingly, it is possible to reduce the influence of process charging on the threshold voltage of the memory transistor and achieve an increase in the speed and a reduction in voltage of the memory.

The memory transistor included in the non-volatile semiconductor memory 200 shown in FIG. 2 of Patent Document 1 has, even in a side wall portion, an ONO structure in which the third silicon oxide film 30, the second silicon nitride film 23, and a silicon oxide film 11 are stacked. In the case where such a memory transistor is formed on the same semiconductor substrate together with a MOS transistor in a peripheral circuit, if these transistors are produced in the same process, a similar ONO structure is formed on the side walls of the MOS transistor, and the ONO structure functions as a parasitic memory cell.

For example, in the case where an N channel MOS transistor is formed in a P well, if a reference potential is applied to the gate of the MOS transistor and also a high potential is applied to the drain of the MOS transistor, hot carriers (holes) are generated and pulled by a gate potential and trapped in the silicon nitride film of the parasitic memory cell. As a result, electrons are attracted to a region in the semiconductor substrate immediately below the parasitic memory cell, and the state is equivalent to a state in which the N-type impurity concentration is partially high, which increases a leak current in the PN junction and causes the characteristics of the MOS transistor to vary.

SUMMARY

An advantage of some aspects of the invention relate to provision of a semiconductor device in which a memory transistor that is a charge trap type memory and a MOS transistor in a peripheral circuit are formed together with on the same semiconductor substrate, wherein the influence of process charging on the threshold voltage of the memory transistor is reduced, and also characteristic variations caused by a parasitic memory cell being formed in a side wall of the MOS transistor are suppressed. Also, another advantage of some aspects of the invention relate to provision of a semiconductor device production method with which the semiconductor device described above can be produced without adding an additional photolithography step to a conventional semiconductor device production process.

A semiconductor device according to a first aspect of the invention includes: a semiconductor substrate; a memory transistor including a first silicon oxide film, a first silicon nitride film, a second silicon oxide film, and a first gate electrode that are disposed in sequence on the semiconductor substrate; and a MOS transistor including a third silicon oxide film and a second gate electrode that are disposed in sequence on the semiconductor substrate, and the memory transistor has a side wall including an extending portion of the first silicon oxide film, a second silicon nitride film that is in contact with the first silicon nitride film, and a fourth silicon oxide film that are disposed in sequence on the semiconductor substrate, and the MOS transistor has a side wall including a fifth silicon oxide film that is disposed on the semiconductor substrate.

According to the first aspect of the invention, a memory transistor that includes a first gate electrode on an ONO structure including a first silicon nitride film and in which the electric charges trapped in the first silicon nitride film can be diffused into a semiconductor substrate via a second silicon nitride film constituting a side wall by process charging and an MOS transistor that includes a second gate electrode on a third silicon oxide film and in which a parasitic memory cell is unlikely to be formed in a side wall including a fifth silicon oxide film disposed on the semiconductor substrate are mounted together on the same semiconductor substrate. Accordingly, it is possible to provide a semiconductor device in which the influence of process charging on the threshold voltage of the memory transistor is reduced, and also characteristic variations caused by a parasitic memory cell being formed in the side wall of the MOS transistor are suppressed.

Here, it is desirable that the fifth silicon oxide film has a thickness greater than a thickness of the first silicon oxide film. Furthermore, it is desirable that the fifth silicon oxide film has a thickness substantially equal to a thickness of the fourth silicon oxide film. With this configuration, even if a silicon nitride film is formed on the fifth silicon oxide film, electric charges are not easily accumulated in the silicon nitride film, and thus a parasitic memory cell is unlikely to be formed in the side wall of the MOS transistor.

Also, the side wall of the MOS transistor may further include a third silicon nitride film that is in contact with a side surface of the second gate electrode and a side surface of the third silicon oxide film. In this case, even if the third silicon nitride film is included in the side wall of the MOS transistor, electric charges can be diffused from the third silicon nitride film into the second gate electrode, and thus a parasitic memory cell is unlikely to be formed in the side wall of the MOS transistor.

Furthermore, the semiconductor device may further include a second MOS transistor including a sixth silicon oxide film and a third gate electrode that are disposed in sequence on the semiconductor substrate, and the second MOS transistor may have a side wall including a fourth silicon nitride film and a seventh silicon oxide film that are disposed in sequence on the semiconductor substrate. In the side wall of the second MOS transistor, the fourth silicon nitride film is disposed directly on the semiconductor substrate, and thus a parasitic memory cell is unlikely to be formed in the side wall of the second MOS transistor.

In this case, the fourth silicon nitride film may have a thickness substantially equal to a thickness of the second silicon nitride film. With this configuration, it is possible to simultaneously form the second silicon nitride film and the fourth silicon nitride film and shorten the semiconductor device production process.

Also, a voltage applied to the MOS transistor may be higher than a voltage applied to the second MOS transistor. In this way, by providing a plurality of types of MOS transistors having different structures and different breakdown voltages and using the high-breakdown voltage MOS transistor in, for example, the memory cell drive circuit that requires a high voltage and the low-breakdown voltage MOS transistor in, for example, the logic circuit that does not require a high voltage, it is possible to optimize the operation of each circuit.

In the above-described configuration, a fifth silicon nitride film that is in contact with the second silicon nitride film may be disposed at least on the memory transistor. With this configuration, the electric charges trapped in the first silicon nitride film of the memory transistor are also diffused into the fifth silicon nitride film via the second silicon nitride film by process charging, and thus the influence of process charging on the threshold voltage of the memory transistor can be further reduced.

A semiconductor device production method according to a second aspect of the invention includes: (a) forming a first silicon oxide film, a first silicon nitride film, and a second silicon oxide film in sequence on a first region of a semiconductor substrate; (b) forming a third silicon oxide film on a second region of the semiconductor substrate; (c) forming a conductive film on the second and third silicon oxide films; (d) forming a first gate electrode on the second silicon oxide film and also forming a second gate electrode on the third silicon oxide film by patterning the conductive film; (e) partially removing the first to third silicon oxide films and the first silicon nitride film by using the first and second gate electrodes as a mask such that a portion of the first silicon oxide film is left around the first gate electrode as viewed in plan view; (f) forming a second silicon nitride film on the first silicon oxide film and the first gate electrode so as to be in contact with the first silicon nitride film and also forming a third silicon nitride film on the second gate electrode; (g) removing at least a portion of the third silicon nitride film; and (h) forming a fourth silicon oxide film on the second silicon nitride film and also forming a fifth silicon oxide film on the second region of the semiconductor substrate.

According to the second aspect of the invention, a memory transistor that includes a first gate electrode on an ONO structure including a first silicon nitride film and in which the electric charges trapped in the first silicon nitride film can be diffused into a semiconductor substrate via a second silicon nitride film constituting a side wall by process charging and a MOS transistor that includes a second gate electrode on a third silicon oxide film and in which at least a portion of a third silicon nitride film constituting a side wall is removed, and thus a parasitic memory cell is unlikely to be formed are simultaneously formed on the same semiconductor substrate. Accordingly, it is possible to produce a semiconductor device in which the influence of process charging on the threshold voltage of the memory transistor can be reduced, and also characteristic variations caused by a parasitic memory cell being formed in the side wall of the MOS transistor are suppressed.

Here, the step (g) may include forming a resist pattern layer at least on the second silicon nitride film and etching the third silicon nitride film by using the resist pattern layer as a mask, and the semiconductor device production method may further include implanting an impurity into the second region of the semiconductor substrate by using at least the resist pattern layer and the second gate electrode as a mask, which is performed between the step (g) and the step (h).

With this configuration, the resist pattern layer used as a mask for etching the third silicon nitride film can be used as a mask for implanting an impurity into the second region of the semiconductor substrate. Accordingly, the semiconductor device described above can be produced without adding an additional photolithography step to a conventional semiconductor device production process.

Also, it is desirable that the fifth silicon oxide film has a thickness greater than a thickness of the first silicon oxide film. With this configuration, even if a silicon nitride film is formed on the fifth silicon oxide film, electric charges are not easily accumulated in the silicon nitride film, and thus a parasitic memory cell is unlikely to be formed in the side wall of the MOS transistor.

Furthermore, the step (g) may include removing a portion of the third silicon nitride film such that the third silicon nitride film that is in contact with a side surface of the second gate electrode and a side surface of the third silicon oxide film is left. In this case, even if the third silicon nitride film is included in the side wall of the MOS transistor, electric charges can be diffused from the third silicon nitride film into the second gate electrode, and thus a parasitic memory cell is unlikely to be formed in the side wall of the MOS transistor.

Alternatively, the step (g) may include entirely removing the third silicon nitride film. If the third silicon nitride film is entirely removed, a parasitic memory cell is not formed in the side wall of the MOS transistor.

In the above-described configuration, the semiconductor device production method may further include forming a sixth silicon oxide film on a third region of the semiconductor substrate, and the step (c) may include forming a conductive film on the sixth silicon oxide film, the step (d) may include forming a third gate electrode on the sixth silicon oxide film by patterning the conductive film, the step (e) may include removing the sixth silicon oxide film by using the third gate electrode as a mask such that the sixth silicon oxide film is not left around the third gate electrode as viewed in plan view, the step (f) may include forming a fourth silicon nitride film on the semiconductor substrate and the third gate electrode, and the step (h) may include forming a seventh silicon oxide film on the fourth silicon nitride film.

With this configuration, a second MOS transistor that includes a third gate electrode on a sixth silicon oxide film and in which a fourth silicon nitride film constituting a side wall is disposed directly on the semiconductor substrate, and thus a parasitic memory cell is unlikely to be formed can be formed on the same semiconductor substrate simultaneously with the memory transistor and the MOS transistor.

Also, the semiconductor device production method may further include forming a fifth silicon nitride film that is in contact with the second silicon nitride film at least on the memory transistor. With this configuration, the electric charges trapped in the first silicon nitride film of the memory transistor are also diffused into the fifth silicon nitride film via the second silicon nitride film by process charging, and thus the influence of process charging on the threshold voltage of the memory transistor can be further reduced.

Furthermore, the step (g) may include removing a portion of the second region of the semiconductor substrate. With this configuration, a fifth silicon oxide film that constitutes the side wall of the MOS transistor is reliably formed on the semiconductor substrate, and thus the strength of the side wall is improved. Alternatively, the step (e) may include removing a portion of a third region of the semiconductor substrate. With this configuration, a fourth silicon nitride film that constitutes the side wall of the second MOS transistor is reliably formed on the semiconductor substrate, which makes formation of a parasitic memory cell more unlikely to occur.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
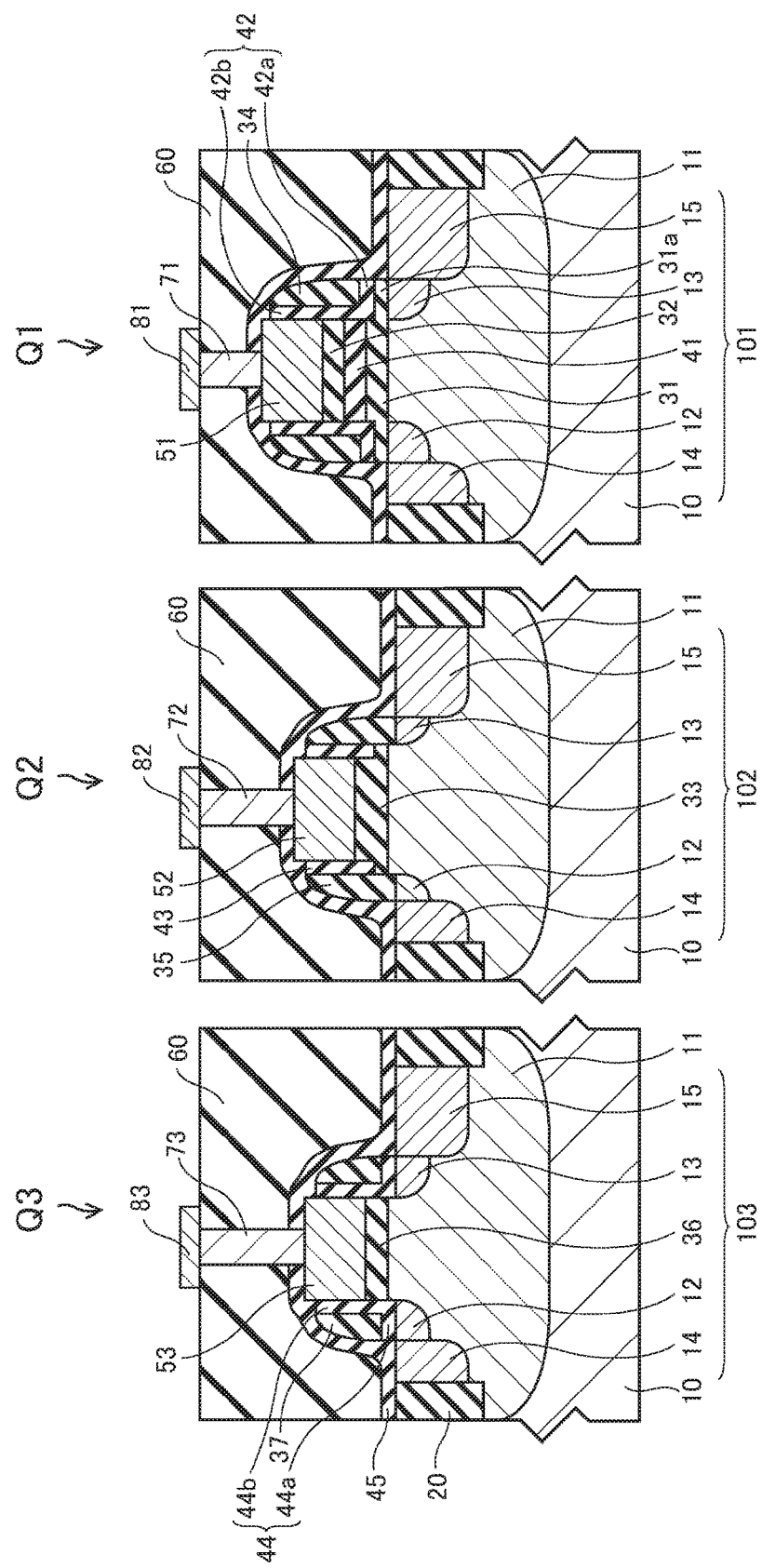
FIG. 1 is a cross-sectional view showing an example of a configuration of a semiconductor device according to an embodiment of the invention.

Hereinafter, an embodiment of the invention will be described in detail with reference to the drawings. The same constituent elements are given the same reference numerals, and a redundant description will be omitted.

In a semiconductor device according to an embodiment of the invention, a charge trap type memory transistor and a MOS transistor in a peripheral circuit are formed together on the same semiconductor substrate.

Configuration of Semiconductor Device

FIG. 1 is a cross-sectional view showing an example of a configuration of a semiconductor device according to an embodiment of the invention. The semiconductor device includes a semiconductor substrate 10, and a charge trap type memory transistor Q1 and a high-breakdown voltage MOS transistor Q2 that are formed on the semiconductor substrate 10, and may further include a low-breakdown voltage MOS transistor Q3 as a second MOS transistor. The transistors Q1 to Q3 may be separated by an element isolation region 20.

As the semiconductor substrate 10, for example, a silicon (Si) wafer containing a P-type or N-type impurity is used. An N-type or P-type well region 11 may be formed in a predetermined region of the semiconductor substrate 10. As the P-type impurity, for example, boron (B) or the like is used, and as the N-type impurity, phosphorus (P), antimony (Sb) or the like is used.

As shown in FIG. 1, the memory transistor Q1 includes a first silicon oxide film ($SiO_2$) 31, a first silicon nitride film ($Si_3N_4$) 41, a second silicon oxide film 32, and a first gate electrode 51 that are disposed in sequence on a first region 101 of the semiconductor substrate 10. With this configuration, a gate insulating film having an ONO structure is formed between the semiconductor substrate 10 and the first gate electrode 51. The gate electrodes of the transistors Q1 to Q3 are made of, for example, impurity-doped conductive polysilicon.

On the other hand, the high-breakdown voltage MOS transistor Q2 includes a third silicon oxide film 33 and a second gate electrode 52 that are disposed in sequence on a second region 102 of the semiconductor substrate 10. The third silicon oxide film 33 constitutes a gate insulating film of the MOS transistor Q2.

Also, the memory transistor Q1 has a side wall on each side of the first gate electrode 51 and the gate insulating film. In each side wall, an extending portion 31a of the first silicon oxide film 31, a second silicon nitride film 42 that is in contact with the first silicon nitride film 41, and a fourth silicon oxide film 34 are disposed in sequence on the semiconductor substrate 10.

The second silicon nitride film 42 may include a first portion 42a extending along a main surface (upper surface in the diagram) of the semiconductor substrate 10 and a second portion 42b extending along a plane that intersects with the main surface of the semiconductor substrate. The first portion 42a opposes the semiconductor substrate 10 via the extending portion 31a of the first silicon oxide film 31 and is in contact with a side surface of the first silicon nitride film 41. The second portion 42b is in contact with a side surface of the first gate electrode 51, a side surface of the second silicon oxide film 32, and the side surface of the first silicon nitride film 41. Alternatively, the second portion 42b may be omitted.

On the other hand, the high-breakdown voltage MOS transistor Q2 has a side wall on each side of the second gate electrode 52 and the gate insulating film. Each side wall includes a fifth silicon oxide film 35 disposed on the semiconductor substrate 10. The side wall of the MOS transistor Q2 may further include a third silicon nitride film 43 that is in contact with a side surface of the second gate electrode 52 and a side surface of the third silicon oxide film 33. Also, the third silicon oxide film 33 may be present between the semiconductor substrate 10 and the third silicon nitride film 43.

The low-breakdown voltage MOS transistor Q3 includes a sixth silicon oxide film 36 and a third gate electrode 53 that are disposed in sequence on a third region 103 of the semiconductor substrate 10. The sixth silicon oxide film 36 constitutes a gate insulating film of the MOS transistor Q3. Also, the MOS transistor Q3 has a side wall on each side of the third gate electrode 53 and the gate insulating film. Each side wall includes a fourth silicon nitride film 44 and a seventh silicon oxide film 37 that are disposed in sequence on the semiconductor substrate 10.

The fourth silicon nitride film 44 may include a first portion 44a extending along the main surface of the semiconductor substrate 10 and a second portion 44b extending along a plane that intersects with the main surface of the semiconductor substrate. Alternatively, the second portion 44b may be omitted. The first portion 44a of the fourth silicon nitride film 44 may have a thickness substantially equal to the thickness of the first portion 42a of the second silicon nitride film 42. With this configuration, it is possible to simultaneously form the second silicon nitride film 42 and the fourth silicon nitride film 44 and shorten the semiconductor device production process.

Within the semiconductor substrate 10, impurity regions 12 to 15 that constitute the source and drain of each of the transistors Q1 to Q3 are formed. Here, the impurity regions 12 and 13 are source/drain extension regions (expansion regions) that are shallowly formed in a surface layer of the semiconductor substrate 10 located below the side walls, and they are also called LDD (lightly doped drain). The extension regions may be omitted depending on the type of transistor.

The impurity regions 12 to 15 of the memory transistor Q1 are provided such that a channel region in the semiconductor substrate 10 located below the first gate electrode 51 is interposed therebetween in a gate length direction (right-left direction in the diagram). The impurity regions 12 to 15 of the high-breakdown voltage MOS transistor Q2 are provided such that a channel region in the semiconductor substrate 10 located below the second gate electrode 52 is interposed therebetween in the gate length direction. The impurity regions 12 to 15 of the low-breakdown voltage MOS transistor Q3 are provided such that a channel region in the semiconductor substrate 10 located below the third gate electrode 53 is interposed therebetween in the gate length direction.

Furthermore, a metal silicide layer made of cobalt silicide (CoSi), titanium silicide (TiSi) or the like may be provided on the impurity regions 14 and 15 of each of the transistors Q1 to Q3 by depositing a metal such as cobalt (Co), titanium (Ti) or the like on the impurity regions 14 and 15 for silicidation and then removing an unreacted metal.

The memory transistor Q1 constitutes a charge trap type non-volatile memory cell. In the memory transistor Q1, the first silicon oxide film 31 serving as a tunnel film, the first silicon nitride film 41 serving as an electric charge accumulation layer, and the second silicon oxide film 32 serving as a block film are stacked so as to form an ONO structure.

The memory transistor Q1 can store data as a result of the threshold voltage being changed by accumulation of electric charges in the electric charge accumulation layer. Here, it is necessary to set the thickness of the tunnel film to an appropriate thickness because if the tunnel film is too thick, electric charges are not easily accumulated in the electric charge accumulation layer, and if the tunnel film is too thin, the electric charges accumulated in the electric charge accumulation layer are easily released into the semiconductor substrate 10.

The third silicon oxide film 33 serving as the gate insulating film of the high-breakdown voltage MOS transistor Q2 is thicker than the sixth silicon oxide film 36 serving as the gate insulating film of the low-breakdown voltage MOS transistor Q3. Accordingly, the voltage applied to the high-breakdown voltage MOS transistor Q2 can be set to a voltage higher than the voltage applied to the low-breakdown voltage MOS transistor Q3.

The high-breakdown voltage MOS transistor Q2 operates at a high voltage of, for example, 5 V, and is used in a memory cell drive circuit (including a switch circuit) for causing the non-volatile memory cell to perform data writing, data erasure, or data read-out. The low-breakdown voltage MOS transistor Q3 operates at a low voltage of, for example, 1.8 V, and is used in a logic circuit, or the like.

In this way, by providing a plurality of types of MOS transistors having different structures and different breakdown voltages and using the high-breakdown voltage MOS transistor Q2 in, for example, the memory cell drive circuit that requires a high voltage and the low-breakdown voltage MOS transistor Q3 in, for example, the logic circuit that does not require a high voltage, it is possible to optimize the operation of each circuit.

Furthermore, a fifth silicon nitride film 45 may be disposed on the transistors Q1 to Q3. An interlayer insulating film 60 made of BPSG (Boron Phosphorus Silicon Glass) or the like is provided on the semiconductor substrate 10 on which the transistors Q1 to Q3 are formed, or on the fifth silicon nitride film 45. The interlayer insulating film 60 has openings in predetermined positions, and interconnects 81 to 83 that are made of aluminum (Al) or the like and disposed on the interlayer insulating film 60 are respectively connected to the gate electrodes of the transistors Q1 to Q3 via plugs 71 to 73 that are made of tungsten (W) or the like and disposed in the openings of the interlayer insulating film 60. Likewise, the sources and the drains of the transistors Q1 to Q3 are also connected to interconnects via plugs (not shown). In this way, a predetermined number of interlayer insulating films and interconnect layers are formed as needed.

In a semiconductor device production process, an etching treatment, a sputtering treatment and the like that use plasma are often used. In such a case, in the memory transistor Q1, plasma-derived electric charges are injected and trapped in the first silicon nitride film 41 that serves as the electric charge accumulation layer and is interposed between the first silicon oxide film 31 and the second silicon oxide film 32. In the specification of the present application, such a phenomenon is referred to as process charging.

In general, a thick silicon oxide film is used as the side walls of a memory transistor. However, when process charging occurs, because the silicon oxide film is highly insulative, it is difficult to diffuse the electric charges trapped in the electric charge accumulation layer by the process charging. Accordingly, if the production process for producing a semiconductor device ends with a large amount of electric charges being trapped in the electric charge accumulation layer, the threshold voltage of the memory transistor varies.

In contrast, with the semiconductor device according to the present embodiment, the second silicon nitride film 42 is provided that is in contact with the first silicon nitride film 41 serving as the electric charge accumulation layer and opposes the semiconductor substrate 10 via the extending portion 31a of the first silicon oxide film 31 serving as the tunnel film. Because a silicon nitride film has lower electric insulation property than a silicon oxide film, the electric charges trapped in the first silicon nitride film 41 by process charging can be diffused into the semiconductor substrate 10 or the like via the second silicon nitride film 42. The second silicon nitride film 42 only need to be an insulating film having lower electric insulation property than a silicon oxide film, and may be, for example, a silicon oxynitride film.

It is desirable that the extending portion 31a of the first silicon oxide film 31 has a thickness less than the thickness of the first silicon oxide film 31 located below the first silicon nitride film 41. With this configuration, the effect of diffusing the electric charges trapped in the first silicon nitride film 41 by process charging into the semiconductor substrate 10 via the second silicon nitride film 42 is enhanced. Preferably, the extending portion 31a of the first silicon oxide film 31 has a thickness of 22 Å or less, and the second silicon nitride film 42 has a thickness of 45 Å or more. When they have the above-described thicknesses, the threshold voltage of the memory transistor Q1 is lowered to a level close to 0.5 V to 0.6 V and stabilized.

Furthermore, in the case where the fifth silicon nitride film 45 that is in contact with the second silicon nitride film 42 is disposed at least on the memory transistor Q1, the electric charges trapped in the first silicon nitride film 41 of the memory transistor Q1 by process charging are also diffused into the fifth silicon nitride film 45 via the second silicon nitride film 42, and thus the influence of process charging on the threshold voltage of the memory transistor Q1 can be further reduced.

Here, the diffusion of the electric charges trapped in the first silicon nitride film 41 is accelerated by performing a heating treatment. As the heating treatment, a heating treatment normally performed in a semiconductor device production process such as activation of impurities implanted into the semiconductor substrate 10 or silicidation of the impurity regions 14 and 15 may be used, or a dedicated heating treatment step may be provided.

On the other hand, in the high-breakdown voltage MOS transistor Q2, if side walls having an ONO structure similar to that of the side walls of the memory transistor Q1 are provided, a parasitic memory cell having an ONO structure is formed. As a result, upon application of a high voltage between the drain and the gate, hot carriers are trapped in the silicon nitride film of the parasitic memory cell, which increases a leak current at the PN junction and causes the characteristics of the MOS transistor Q2 to vary.

To address this, in the semiconductor device according to the present embodiment, the memory transistor Q1 that includes the first gate electrode 51 on an ONO structure including the first silicon nitride film 41 and in which the electric charges trapped in the first silicon nitride film 41 by process charging can be diffused into the semiconductor substrate 10 and the like via the second silicon nitride film 42 constituting the side walls and the MOS transistor Q2 that includes the second gate electrode 52 on the third silicon oxide film 33 and in which a parasitic memory cell is unlikely to be formed in the side walls including the fifth silicon oxide film 35 disposed on the semiconductor substrate 10 are formed together on the same the semiconductor substrate 10. Accordingly, it is possible to provide a semiconductor device in which the influence of process charging on the threshold voltage of the memory transistor Q1 is reduced and also characteristic variations caused by a parasitic memory cell being formed in the side walls of the MOS transistor Q2 are suppressed.

Here, it is desirable that the fifth silicon oxide film 35 has a thickness greater than the thickness of the first silicon oxide film 31. Furthermore, it is desirable that the fifth silicon oxide film 35 has a thickness substantially equal to the thickness of the fourth silicon oxide film 34. With this configuration, even if a silicon nitride film is formed on the fifth silicon oxide film 35, electric charges are not easily accumulated in the silicon nitride film, and thus a parasitic memory cell is unlikely to be formed in the side walls of the MOS transistor Q2. As used herein, the term "thickness" refers to a thickness in a direction perpendicular to the main surface of the semiconductor substrate 10.

Also, even if the third silicon nitride film 43 is included in the side walls of the high-breakdown voltage MOS transistor Q2, the third silicon nitride film 43 is in contact with the side surfaces of the second gate electrode 52. With this configuration, electric charges can be diffused from the third silicon nitride film 43 into the second gate electrode 52, and thus a parasitic memory cell is unlikely to be formed in the side walls of the high-breakdown voltage MOS transistor Q2.

Furthermore, the low-breakdown voltage MOS transistor Q3 has side walls including the fourth silicon nitride film 44 and the seventh silicon oxide film 37 that are disposed in sequence on the semiconductor substrate 10. In this way, in the side walls of the MOS transistor Q3, the fourth silicon nitride film 44 is disposed directly on the semiconductor substrate 10, and thus a parasitic memory cell is unlikely to be formed in the side walls of the MOS transistor Q3.

In FIG. 1, in the side walls of the memory transistor Q1, the MOS transistor Q2, and the MOS transistor Q3, the fourth silicon oxide film 34, the fifth silicon oxide film 35, and the seventh silicon oxide film 37 are shown as having a thick configuration, but they may be in the form of a film similar to the second silicon nitride film 42. Furthermore, a film-like or thick silicon nitride film may be provided thereon. However, it is desirable that such a silicon nitride film is in contact with the second silicon nitride film 42 as with the fifth silicon nitride film 45. Also, in the case where the fifth silicon oxide film 35 is in the form of a film as well, it is desirable that the fifth silicon oxide film 35 has a thickness greater than the thickness of the first silicon oxide film 31.

Semiconductor Device Production Method

Next, a semiconductor device production method according to an embodiment of the invention will be described.

According to the semiconductor device production method according to an embodiment of the invention, a charge trap type memory transistor and a MOS transistor in a peripheral circuit are simultaneously formed on the same semiconductor substrate. As the MOS transistor in a peripheral circuit, a high-breakdown voltage MOS transistor is formed, and furthermore, a low-breakdown voltage MOS transistor may be formed as a second MOS transistor.

FIGS. 2 to 21 are cross-sectional views showing first to twentieth steps of the semiconductor device production method according to an embodiment of the invention. As the semiconductor substrate 10, for example, a silicon (Si) wafer containing a P-type or N-type impurity is prepared. As the P-type impurity, for example, boron (B) or the like is used, and as the N-type impurity, phosphorus (P), antimony (Sb) or the like is used.

Formation of Element Isolation Region

Figure 2:
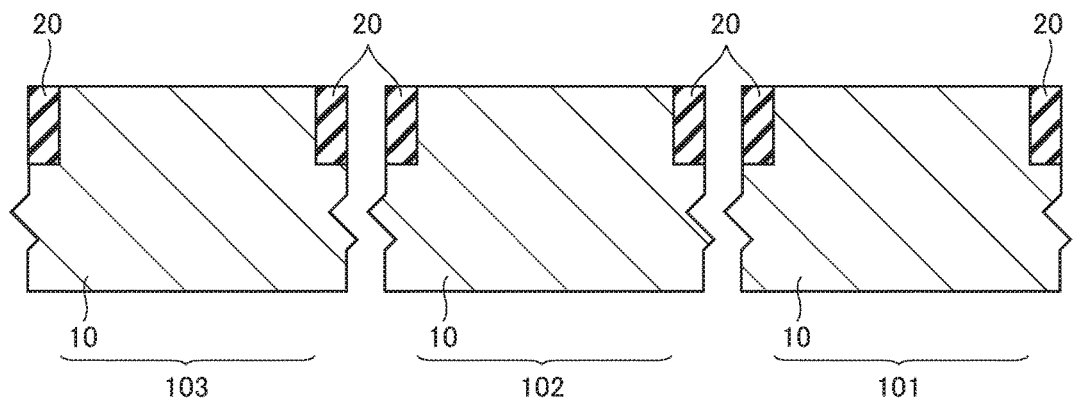
FIG. 2 is a cross-sectional view showing a first step of a semiconductor device production method according to an embodiment of the invention.

In a first step shown in FIG. 2, the native oxide film of the semiconductor substrate 10 is removed with an aqueous hydrofluoric acid (HF) solution or the like, and element isolation regions 20 for separating a plurality of adjacent elements from each other are formed on the semiconductor substrate 10 by, for example, an STI (shallow trench isolation) method. Instead of the STI method, it is also possible to use a LOCOS (local oxidation of silicon) method, or the like. After that, the semiconductor substrate 10 is subjected to cleaning (for example, RCA cleaning). RCA cleaning is wet cleaning in which cleaning that uses ammonia and a hydrogen peroxide solution and cleaning that uses hydrochloric acid and a hydrogen peroxide solution are combined.

Formation of Well

Figure 3:
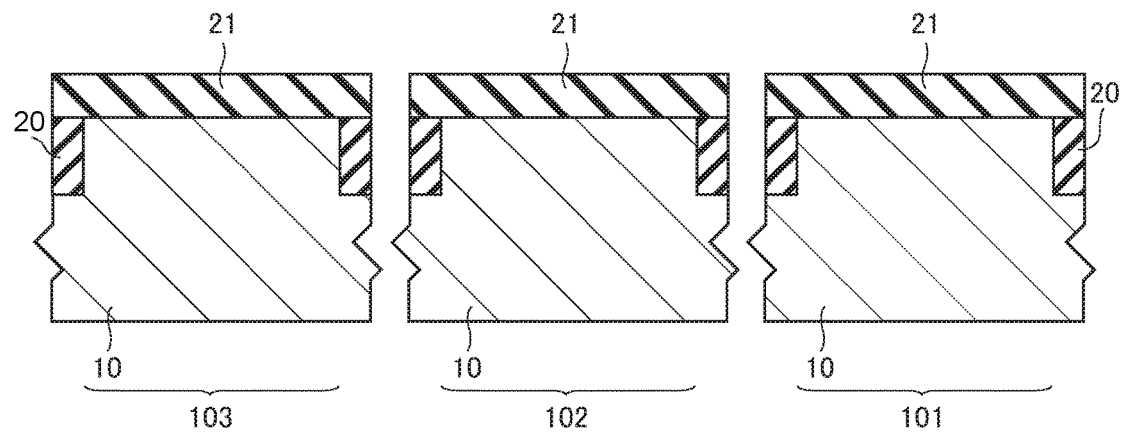
FIG. 3 is a cross-sectional view showing a second step of the semiconductor device production method according to an embodiment of the invention.
Figure 4:
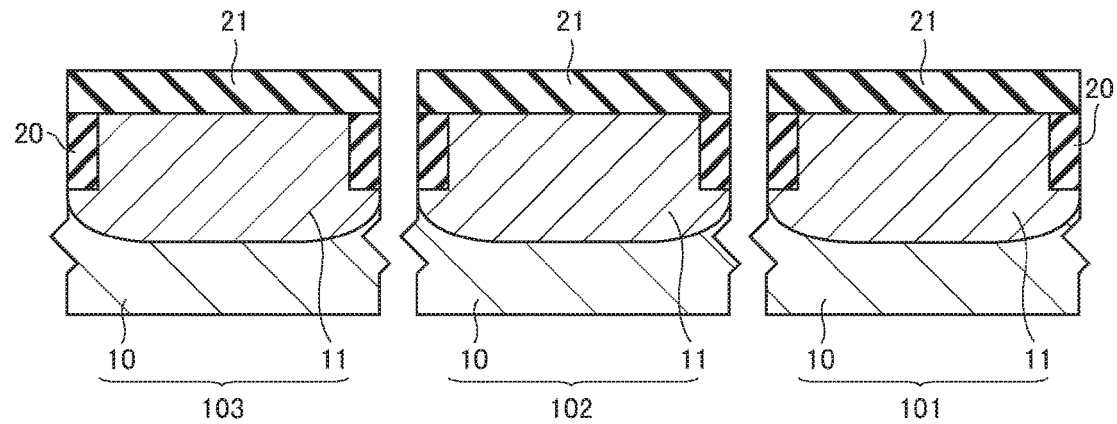
FIG. 4 is a cross-sectional view showing a third step of the semiconductor device production method according to an embodiment of the invention.

Next, in a second step shown in FIG. 3, a preliminary oxide film (silicon oxide film) 21 is formed on the semiconductor substrate 10, in which the element isolation regions 20 have been formed, by a thermal oxidation treatment or the like. The preliminary oxide film 21 has a thickness of, for example, about 100 Å. Furthermore, in a third step shown in FIG. 4, N-type or P-type well regions 11 may be formed in the semiconductor substrate 10.

Figure 5:
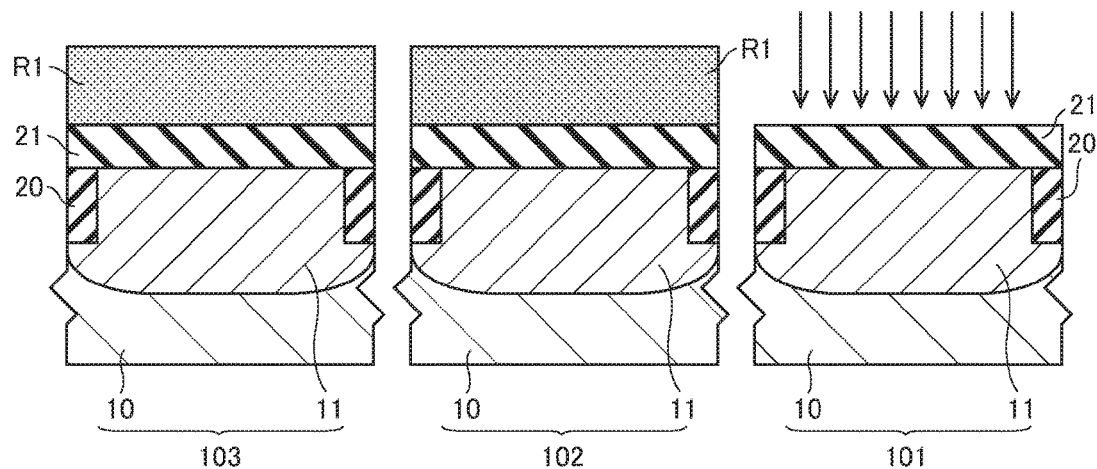
FIG. 5 is a cross-sectional view showing a fourth step of the semiconductor device production method according to an embodiment of the invention.

Next, in a fourth step shown in FIG. 5, in order to adjust the threshold voltage of each transistor, a dopant (impurity ions) of a type corresponding to the type of transistor may be implanted into the semiconductor substrate 10 (the well region 11) in a dose corresponding to the characteristics (threshold voltage) of the transistor. For example, in the case where a dopant is implanted into a first region 101 where a memory transistor is to be formed, a resist is applied onto the preliminary oxide film 21, and exposure and development are performed by a photolithography method that uses a photomask, and a resist pattern layer R1 is thereby formed.

As shown in FIG. 5, the resist pattern layer R1 exposes the preliminary oxide film 21 of the first region 101 where a memory transistor is to be formed while covering the preliminary oxide film 21 on the second region 102 where a high-breakdown voltage MOS transistor is to be formed and the third region 103 where a low-breakdown voltage MOS transistor is to be formed.

A dopant is implanted into the first region 101 of the semiconductor substrate 10 (the well region 11) by using the resist pattern layer R1 as a mask. After that, the resist pattern layer R1 is removed through cleaning. Likewise, a dopant may be implanted into the second region 102 and the third region 103 of the semiconductor substrate 10.

Figure 6:
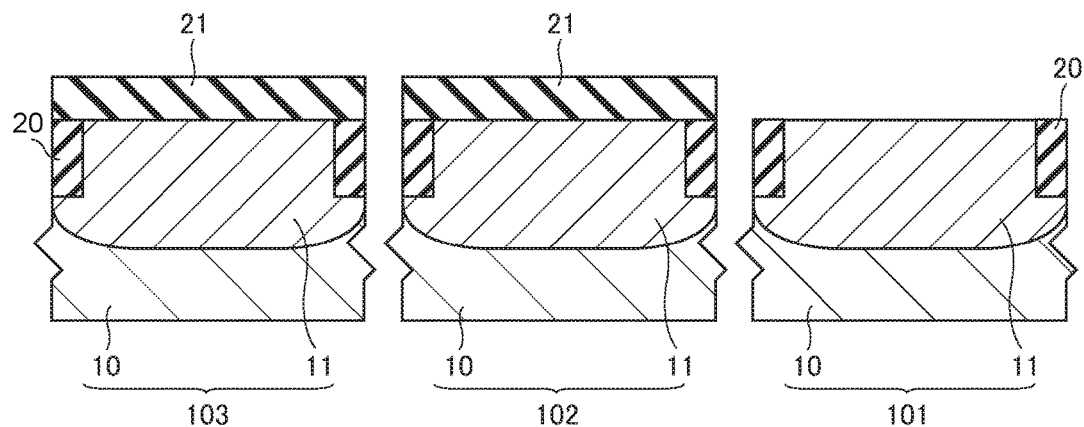
FIG. 6 is a cross-sectional view showing a fifth step of the semiconductor device production method according to an embodiment of the invention.

Next, in a fifth step shown in FIG. 6, the preliminary oxide film 21 of the first region 101 is removed. For example, a resist is applied onto the preliminary oxide film 21, and exposure and development are performed by a photolithography method that uses a photomask, and a resist pattern layer that exposes the preliminary oxide film 21 of the first region 101 is formed on the preliminary oxide film 21 in the second region 102 and the third region 103.

By using the resist pattern layer as a mask, the preliminary oxide film 21 of the first region 101 is wet etched with, for example, BHF (an aqueous solution of hydrofluoric acid and ammonium fluoride). By doing so, as shown in FIG. 6, in the first region 101, the semiconductor substrate 10 (the well region 11) is exposed. After that, the resist pattern layer is removed through cleaning.

Formation of ONO Film in Memory Transistor

Figure 7:
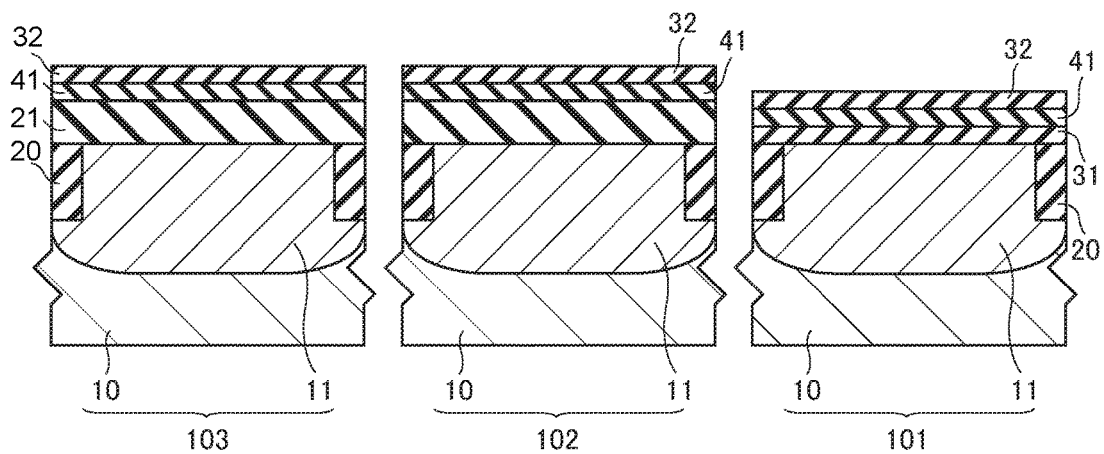
FIG. 7 is a cross-sectional view showing a sixth step of the semiconductor device production method according to an embodiment of the invention.

Next, in a sixth step shown in FIG. 7, a first silicon oxide film 31, a first silicon nitride film 41, and a second silicon oxide film 32 are formed in sequence on the first region 101 of the semiconductor substrate 10.

First, a first silicon oxide film 31 serving as a tunnel film is formed on the first region 101 of the semiconductor substrate 10. To be specific, the first silicon oxide film 31 may be formed by performing thermal oxidation on the surface of the semiconductor substrate 10. The thermal oxidation treatment may be, for example, a dry oxidation treatment that uses dry oxygen ($O_2$) as an oxidizing gas, or a steam oxidation treatment that uses steam ($H_2O$) and oxygen or nitrogen ($N_2$). The temperature range for the thermal oxidation treatment is, for example, 650° C. to 900° C. In practice, when thermal oxidation is performed on the surface of the first region 101 of the semiconductor substrate 10, the thickness of the preliminary oxide film 21 in the second region 102 and the third region 103 slightly increases.

After that, a first silicon nitride film 41 serving as an electric charge accumulation layer is formed on the first silicon oxide film 31 and the preliminary oxide film 21. The first silicon nitride film 41 is formed by, for example, a CVD (chemical vapor deposition) method that uses ammonia ($NH_3$) and dichlorosilane (DCS, $SiH_2Cl_2$) as reactant gases. Instead of dichlorosilane, it is also possible to use hexachlorodisilane (HCD, $Si_2Cl_6$) or the like.

After that, a second silicon oxide film 32 serving as a block film is formed on the first silicon nitride film 41. The second silicon oxide film 32 is formed by, for example, a CVD method that uses dichlorosilane and nitrogen monoxide (NO) as reactant gases. A silicon oxide film formed by the CVD method under a high temperature environment is also called HTO (high temperature oxide) film. Instead of dichlorosilane, it is also possible to use hexachlorodisilane or the like. Also, instead of nitrogen monoxide, it is also possible to use nitrogen dioxide ($NO_2$) or the like.

The first silicon oxide film 31, the first silicon nitride film 41, and the second silicon oxide film 32 that are formed in sequence on the first region 101 of the semiconductor substrate 10 are also called ONO film, and constitute a gate insulating film for a memory transistor. The total thickness of the ONO film is, for example, within a range of 100 Å to 130 Å.

Figure 8:
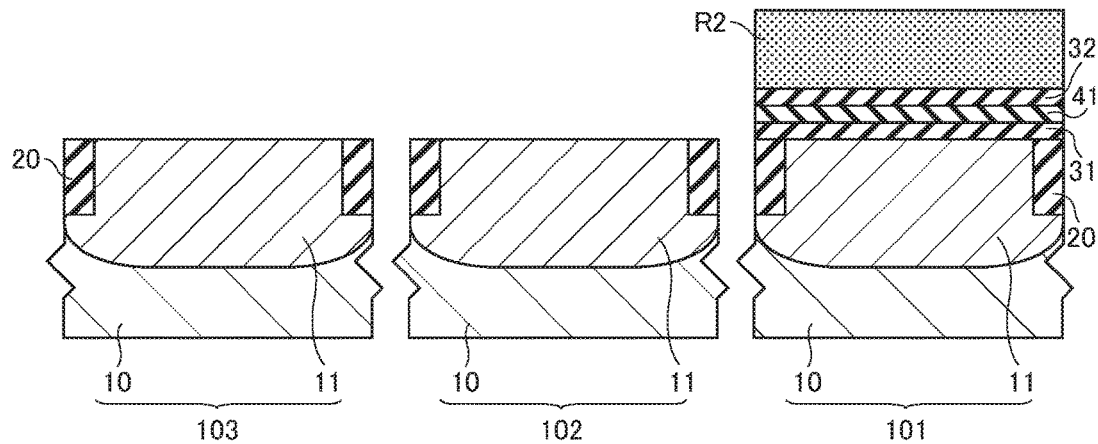
FIG. 8 is a cross-sectional view showing a seventh step of the semiconductor device production method according to an embodiment of the invention.

Next, in a seventh step shown in FIG. 8, the ONO film is selectively removed. For example, a resist is applied onto the second silicon oxide film 32, and exposure and development are performed by a photolithography method that uses a photomask, and a resist pattern layer R2 is thereby formed on the second silicon oxide film 32 of the first region 101. The resist pattern layer R2 exposes the second silicon oxide film 32 in the second region 102 and the third region 103. The second silicon oxide film 32, the first silicon nitride film 41, and the preliminary oxide film 21 in the second region 102 and the third region 103 are sequentially etched by using the resist pattern layer R2 as a mask.

To be specific, the second silicon oxide film 32 and the first silicon nitride film 41 in the second region 102 and the third region 103 may be removed by CDE (chemical dry etching). Also, the preliminary oxide film 21 in the second region 102 and the third region 103 may be removed by wet etching (for example, BHF etching). By doing so, in the second region 102 and the third region 103, the semiconductor substrate 10 (the well regions 11) is exposed. After that, the resist pattern layer R2 is removed through cleaning.

Formation of Gate Insulating Film for High-Breakdown Voltage Transistor

Figure 9:
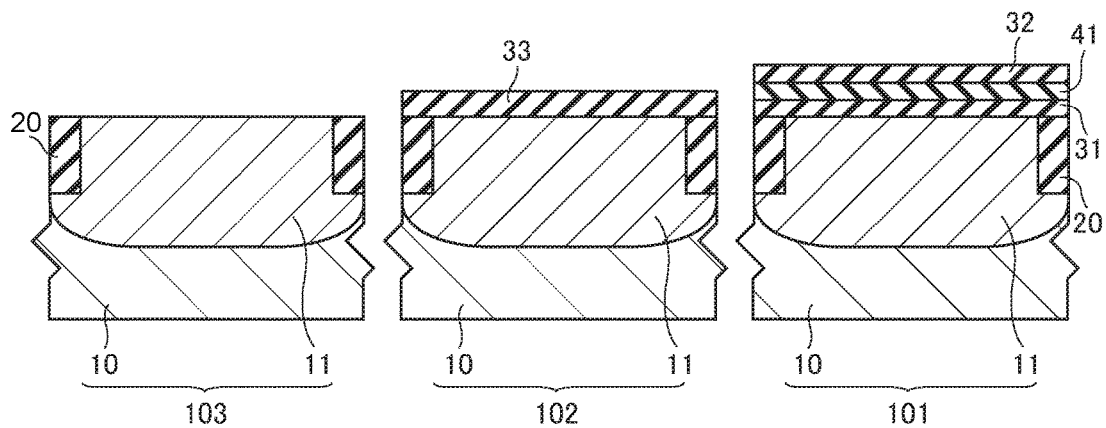
FIG. 9 is a cross-sectional view showing an eighth step of the semiconductor device production method according to an embodiment of the invention.

Next, in an eighth step shown in FIG. 9, a third silicon oxide film 33 is formed on the second region 102 of the semiconductor substrate 10, the third silicon oxide film 33 serving as a gate insulating film for a high-breakdown voltage MOS transistor. The third silicon oxide film 33 has a thickness of, for example, about 100 Å.

For example, through a thermal oxidation treatment or the like, a silicon oxide film is formed on the semiconductor substrate 10 having the ONO film formed thereon. Next, a resist is applied onto the semiconductor substrate 10 having the silicon oxide film formed thereon, and exposure and development are performed by a photolithography method that uses a photomask, and a resist pattern layer that exposes the first region 101 and the third region 103 of the semiconductor substrate 10 is thereby formed on the second region 102 of the semiconductor substrate 10. An unnecessary silicon oxide film is removed through etching by using the resist pattern layer as a mask. As a result, a third silicon oxide film 33 is formed on the second region 102 of the semiconductor substrate 10. After that, the resist pattern layer is removed through cleaning.

Formation of Gate Insulating Film for Low-Breakdown Voltage Transistor

Figure 10:
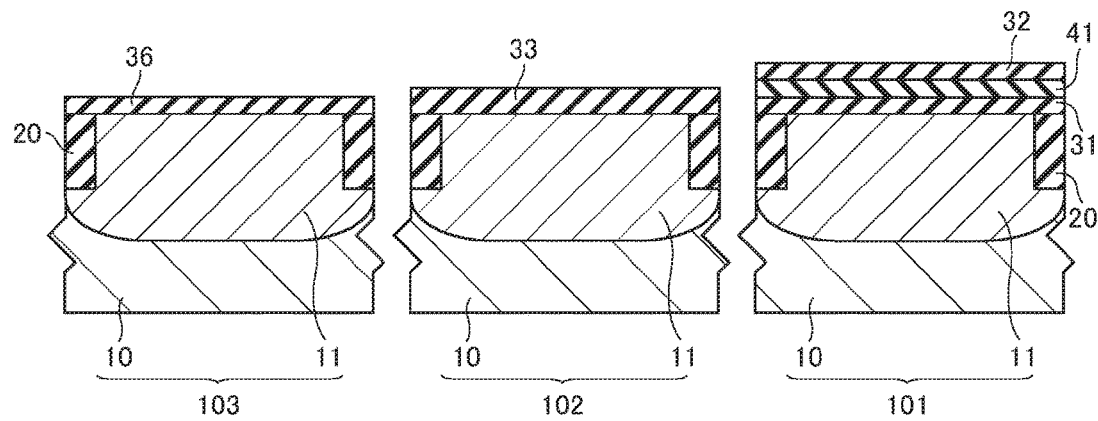
FIG. 10 is a cross-sectional view showing a ninth step of the semiconductor device production method according to an embodiment of the invention.

Next, in a ninth step shown in FIG. 10, a sixth silicon oxide film 36 is formed on the third region 103 of the semiconductor substrate 10 through, for example, a thermal oxidation treatment or the like, the sixth silicon oxide film 36 serving as a gate insulating film for a low-breakdown voltage MOS transistor. The sixth silicon oxide film 36 has a thickness of, for example, about 30 Å.

In practice, when thermal oxidation is performed on the surface of the semiconductor substrate 10, the thickness of the third silicon oxide film 33 of the second region 102 slightly increases, but the thickness of the second silicon oxide film 32 of the first region 101 little increases. In FIGS. 9 and 10, the gate insulating film for a low-breakdown voltage transistor is formed after the gate insulating film for a high-breakdown voltage transistor has been formed, but the gate insulating film for a high-breakdown voltage transistor may be formed after the gate insulating film for a low-breakdown voltage transistor has been formed.

Formation of Gate Electrode

Figure 11:
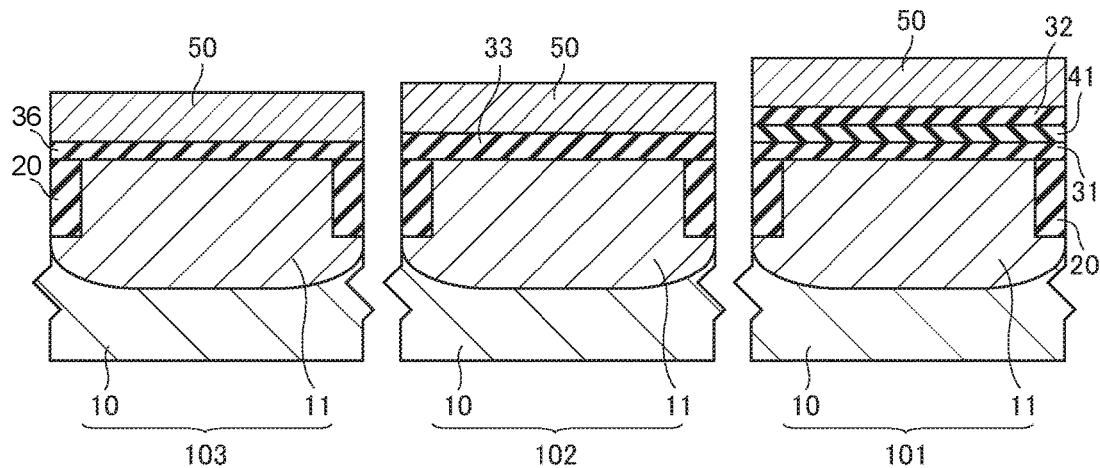
FIG. 11 is a cross-sectional view showing a tenth step of the semiconductor device production method according to an embodiment of the invention.

Next, in a tenth step shown in FIG. 11, a conductive film 50 is formed on the second silicon oxide film 32 of the first region 101, the third silicon oxide film 33 of the second region 102, and the sixth silicon oxide film 36 of the third region 103. For example, the conductive film 50 is formed by implanting a dopant (for example, impurity ions such as arsenic) into a non-doped polysilicon film. The non-doped polysilicon film is formed by, for example, a CVD method that uses silane ($SiH_4$) as a reactant gas. Alternatively, the conductive film 50 may be formed by a CVD method that uses silane ($SiH_4$) and phosphine ($PH_3$) as reactant gases.

Figure 12:
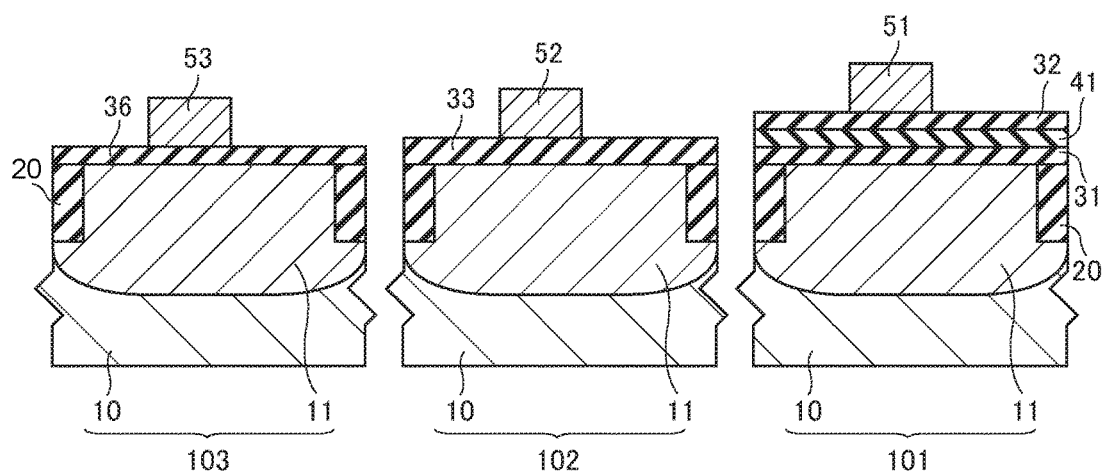
FIG. 12 is a cross-sectional view showing an eleventh step of the semiconductor device production method according to an embodiment of the invention.

Next, in an eleventh step shown in FIG. 12, patterning is performed on the conductive film 50 (FIG. 11), as a result of which a first gate electrode 51 is formed on the second silicon oxide film 32, a second gate electrode 52 is formed on the third silicon oxide film 33, and a third gate electrode 53 is formed on the sixth silicon oxide film 36.

For example, a resist is applied onto the conductive film 50 shown in FIG. 11, exposure and development are performed by a photolithography method that uses a photomask, and a resist pattern layer is thereby formed on a portion of the second silicon oxide film 32, a portion of the third silicon oxide film 33, and a portion of the sixth silicon oxide film 36.

The conductive film 50 is dry etched by using the resist pattern layer as a mask. At this time, dry etching may end when, for example, the sixth silicon oxide film 36 located under the conductive film 50 in the third region 103 is exposed. As a result, as shown in FIG. 12, a first gate electrode 51 is formed in the first region 101, a second gate electrode 52 is formed in the second region 102, and a third gate electrode 53 is formed in the third region 103. After that, the resist pattern layer may be removed through cleaning.

Formation of Extension Region in Low-Breakdown Voltage Transistor

Figure 13:
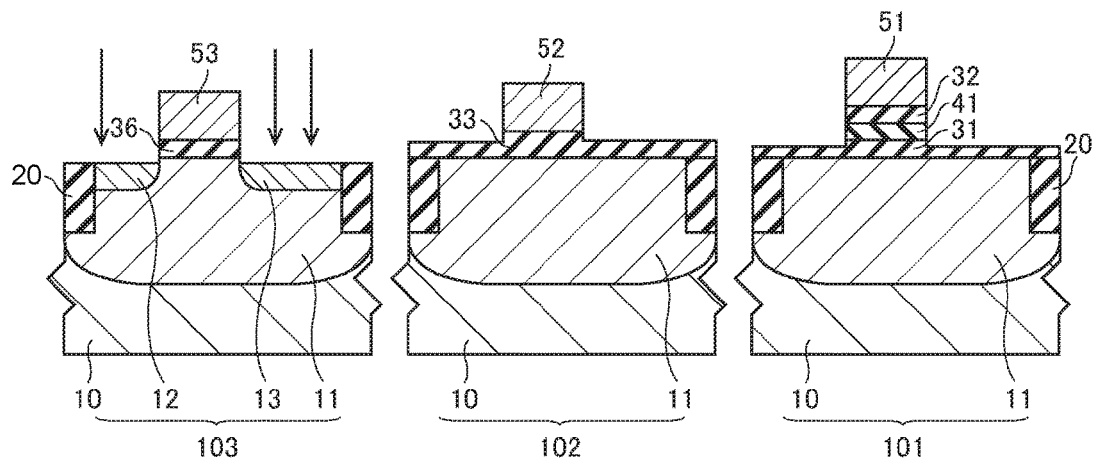
FIG. 13 is a cross-sectional view showing a twelfth step of the semiconductor device production method according to an embodiment of the invention.

Next, in a twelfth step shown in FIG. 13, impurity regions 12 and 13 are formed in the third region 103 of the semiconductor substrate 10, the impurity regions 12 and 13 serving as source and drain extension regions for a low-breakdown voltage MOS transistor. That is, a dopant (for example, impurity ions such as arsenic or phosphorus) that is necessary to form the impurity regions 12 and 13 in the third region 103 is implanted into the third region 103 of the semiconductor substrate 10.

To be specific, first, a resist is applied onto the second silicon oxide film 32 and the first gate electrode 51 in the first region 101, the third silicon oxide film 33 and the second gate electrode 52 in the second region 102, and the sixth silicon oxide film 36 and the third gate electrode 53 in the third region 103 shown in FIG. 12. Furthermore, exposure and development are performed by a photolithography method that uses a photomask, and a resist pattern layer that exposes the sixth silicon oxide film 36 and the third gate electrode 53 in the third region 103 is thereby formed.

A dopant is implanted into a portion of the third region 103 of the semiconductor substrate 10 by using the resist pattern layer and the third gate electrode 53 as a mask. As a result, as shown in FIG. 13, impurity regions 12 and 13 are formed in the third region 103 of the semiconductor substrate 10 next to the third gate electrode 53 as viewed in plan view. In the specification of the present application, the expression "as viewed in plan view" refers to viewing the constituent elements from a direction vertical to the main surface of the semiconductor substrate 10.

After that, the resist pattern layer is removed through a cleaning treatment. The cleaning treatment of cleaning the resist pattern layer is performed by, for example, wet cleaning, ash cleaning, or the like. The wet cleaning may be, for example, RCA cleaning, or may be ammonia and hydrogen peroxide solution cleaning during RCA cleaning. The ash cleaning may be photoexcitation ash cleaning in which the resist pattern layer is stripped by a chemical reaction between a gas such as ozone or oxygen and the resist, or may be plasma ash cleaning in which the resist pattern layer is stripped by using plasma obtained by energizing an oxygen gas into the plasma by using a high frequency wave or the like.

As shown in FIG. 13, through the cleaning treatment of cleaning the resist pattern layer, the second silicon oxide film 32 and the first silicon nitride film 41 around the first gate electrode 51 as viewed in plan view are completely removed. However, although an upper portion of the first silicon oxide film 31 around the first gate electrode 51 as viewed in plan view is removed, the remaining portion (lower portion) is not removed and is left. Likewise, an upper portion of the third silicon oxide film 33 around the second gate electrode 52 as viewed in plan view is removed, but the remaining portion (lower portion) is not removed and is left. Alternatively, the third silicon oxide film 33 around the second gate electrode 52 as viewed in plan view may be entirely removed. Furthermore, the sixth silicon oxide film 36 around the third gate electrode 53 as viewed in plan view is completely removed.

In this way, the first to third silicon oxide films 31 to 33 and the first silicon nitride film 41 are partially removed by using the first gate electrode 51 and the second gate electrode 52 as a mask such that a portion of the first silicon oxide film 31 is left around the first gate electrode 51 as viewed in plan view, and a portion of the third silicon oxide film 33 is left around the second gate electrode 52 as viewed in plan view.

Also, in the twelfth step shown in FIG. 13, a portion (upper portion) of the third region 103 of the semiconductor substrate 10 around the third gate electrode 53 as viewed in plan view may be removed. By doing so, as shown in FIG. 1, a fourth silicon nitride film 44 that constitutes the side walls of the low-breakdown voltage MOS transistor Q3 is reliably formed on the semiconductor substrate 10, and thus a parasitic memory cell is more unlikely to be formed.

Formation of Extension Region in Memory Transistor

Figure 14:
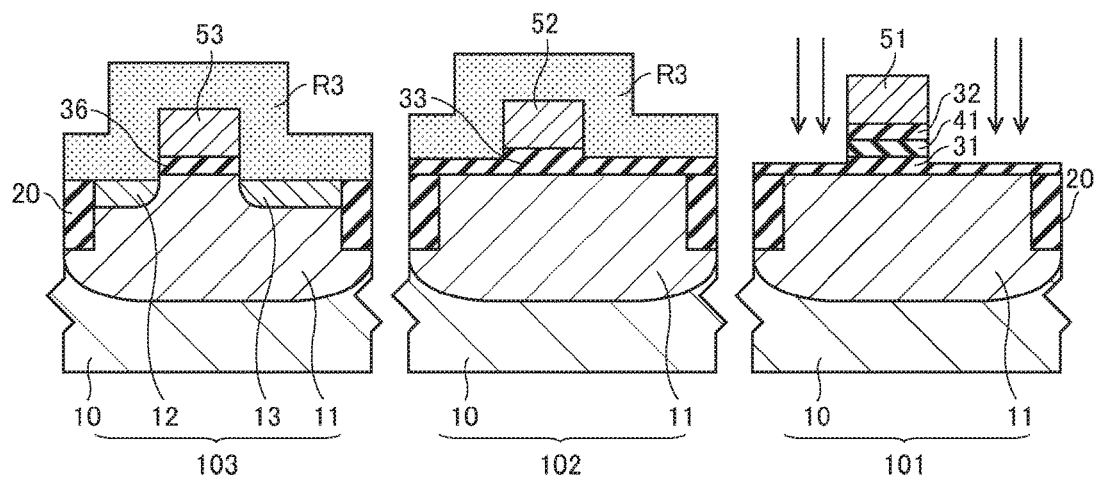
FIG. 14 is a cross-sectional view showing a thirteenth step of the semiconductor device production method according to an embodiment of the invention.
Figure 15:
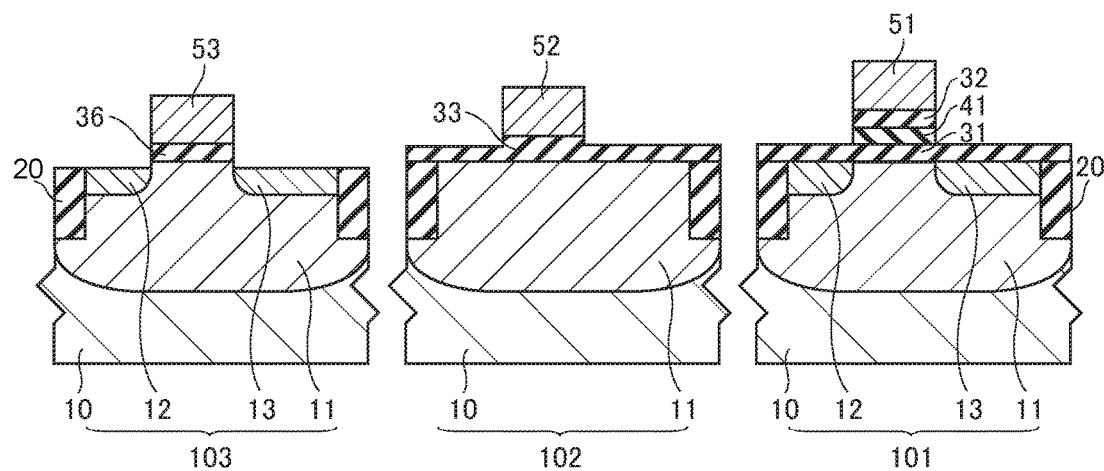
FIG. 15 is a cross-sectional view showing a fourteenth step of the semiconductor device production method according to an embodiment of the invention.

Next, in a thirteenth step shown in FIG. 14 and a fourteenth step shown in FIG. 15, impurity regions 12 and 13 serving as source and drain extension regions for a memory transistor are formed in the first region 101 of the semiconductor substrate 10. That is, a dopant (for example, impurity ions such as arsenic or phosphorus) that is necessary to form the impurity regions 12 and 13 in the first region 101 is implanted into the first region 101 of the semiconductor substrate 10.

To be specific, first, a resist is applied onto the first silicon oxide film 31 and the first gate electrode 51 in the first region 101, the third silicon oxide film 33 and the second gate electrode 52 in the second region 102, and the semiconductor substrate 10 and the third gate electrode 53 in the third region 103. Furthermore, exposure and development are performed by a photolithography method that uses a photomask, and as shown in FIG. 14, a resist pattern layer R3 that exposes the first silicon oxide film 31 and the first gate electrode 51 in the first region 101 is formed.

A dopant is implanted into a portion of the first region 101 of the semiconductor substrate 10 by using the resist pattern layer R3 and the first gate electrode 51 as a mask. As a result, as shown in FIG. 15, impurity regions 12 and 13 are formed in the first region 101 of the semiconductor substrate 10 next to the first gate electrode 51 as viewed in plan view. After that, the resist pattern layer is removed through a cleaning treatment. At this time, the third silicon oxide film 33 around the second gate electrode 52 preferably has a thickness of 50 Å or less, and more preferably 20 Å or less.

In the present embodiment, in order to inject hot carriers into the first silicon nitride film 41, the dopant dose in the impurity regions 12 and 13 of the first region 101 is, for example, $7 \times 10^{14}$ ions/cm$^2$ or more.

As shown in FIG. 15, the second silicon oxide film 32 and the first silicon nitride film 41 around the first gate electrode 51 are completely removed, and an upper portion of the first silicon oxide film 31 around the first gate electrode 51 is removed. Accordingly, the dopant dose (impurity concentration) can be adjusted with high accuracy at the time of implantation of a dopant that is necessary to form the impurity regions 12 and 13 in the first region 101.

At this time, because there is no disturbance caused by the second silicon oxide film 32 and the first silicon nitride film 41, and there is a little disturbance caused by the first silicon oxide film 31, the dopant can be shallowly implanted into the first region 101 of the semiconductor substrate 10 (the well region 11) by making adjustment so as to lower the dopant implantation energy.

Formation of Side Wall 1

Figure 16:
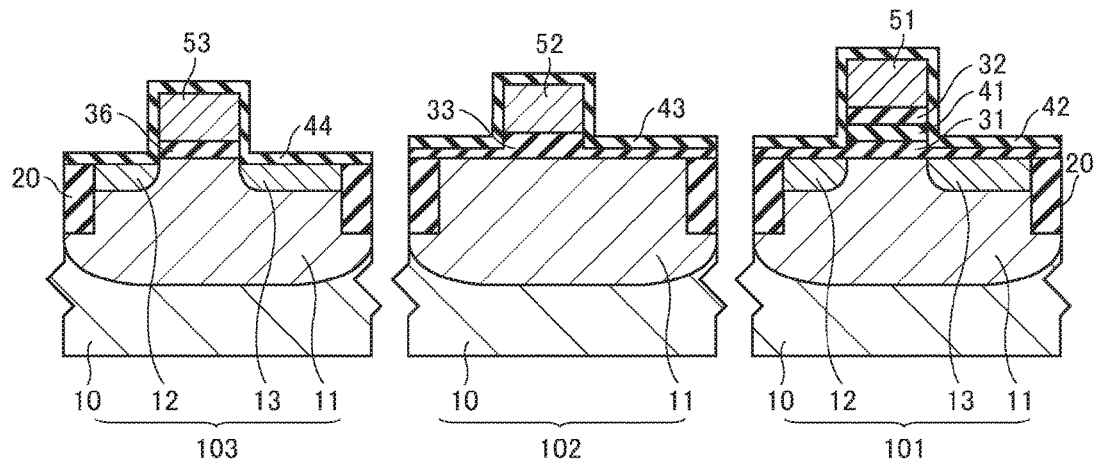
FIG. 16 is a cross-sectional view showing a fifteenth step of the semiconductor device production method according to an embodiment of the invention.

Next, in a fifteenth step shown in FIG. 16, a silicon nitride film is formed on the transistors formed in the first to third regions 101 to 103. That is, a second silicon nitride film 42 is formed on the first silicon oxide film 31 and the first gate electrode 51 in the first region 101 so as to be in contact with the first silicon nitride film 41. Also, a third silicon nitride film 43 is formed on the third silicon oxide film 33 and the second gate electrode 52 in the second region 102. Furthermore, a fourth silicon nitride film 44 is formed on the third region 103 of the semiconductor substrate 10 and the third gate electrode 53.

As a result of simultaneous formation of the second silicon nitride film 42 and the fourth silicon nitride film 44, a first portion of the second silicon nitride film 42 extending along the main surface of the semiconductor substrate 10 and a first portion of the fourth silicon nitride film 44 extending along the main surface of the semiconductor substrate 10 have a substantially equal thickness.

Next, at least a portion of the third silicon nitride film 43 is removed. For example, in a sixteenth step shown in FIG. 17, a resist is applied onto the second silicon nitride film 42 in the first region 101 and the fourth silicon nitride film 44 in the third region 103, and exposure and development are performed by a photolithography method that uses a photomask, and a resist pattern layer R4 is thereby formed on the second silicon nitride film 42 and the fourth silicon nitride film 44. The resist pattern layer R4 exposes the third silicon nitride film 43.

Figure 18:
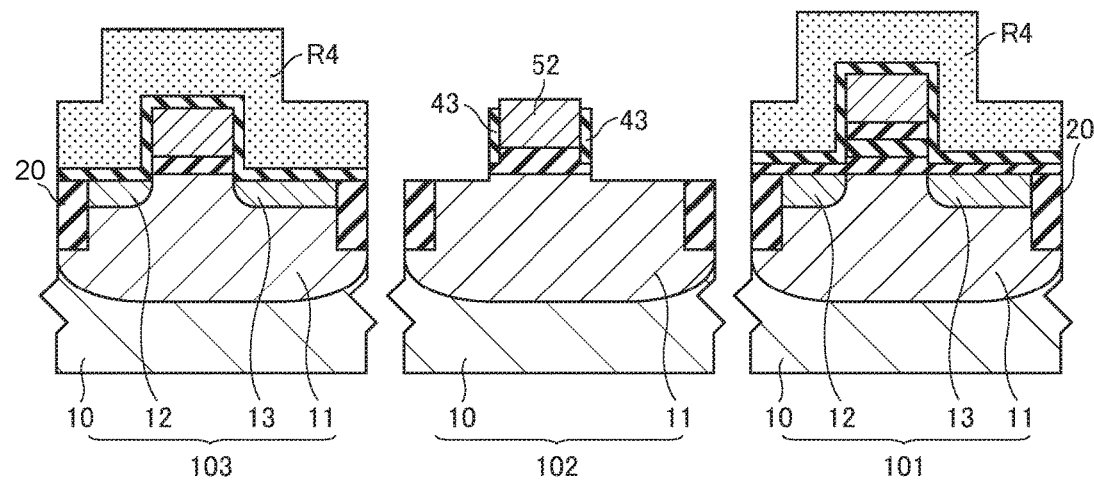
FIG. 18 is a cross-sectional view showing a seventeenth step of the semiconductor device production method according to an embodiment of the invention.

Next, in a seventeenth step shown in FIG. 18, the third silicon nitride film 43 is etched by using the resist pattern layer R4 and the second gate electrode 52 as a mask, as a result of which at least a portion of the third silicon nitride film 43 is removed. The etching is preferably dry etching.

At this time, it is possible to remove a portion of the third silicon nitride film 43 such that the third silicon nitride film 43 is left in a portion of the side surfaces of the second gate electrode 52 and the third silicon oxide film 33. In this case, as shown in FIG. 1, even if the third silicon nitride film 43 is included in the side walls of the high-breakdown voltage MOS transistor Q2, electric charges can be diffused from the third silicon nitride film 43 into the second gate electrode 52, and thus a parasitic memory cell is unlikely to be formed in the side walls of the MOS transistor Q2. Alternatively, in the seventeenth step, the third silicon nitride film 43 may be entirely removed. If the third silicon nitride film 43 is entirely removed, a parasitic memory cell is not formed on the side walls of the MOS transistor Q2.

Also, in the seventeenth step, a portion (upper portion) of the second region 102 of the semiconductor substrate 10 around the second gate electrode 52 as viewed in plan view may be removed. By doing so, as shown in FIG. 1, a fifth silicon oxide film 35 that constitutes the side walls of the high-breakdown voltage MOS transistor Q2 is reliably formed on the semiconductor substrate 10, and thus the strength of the side walls is improved.

Formation of Extension Region in High-Breakdown Voltage Transistor

Figure 19:
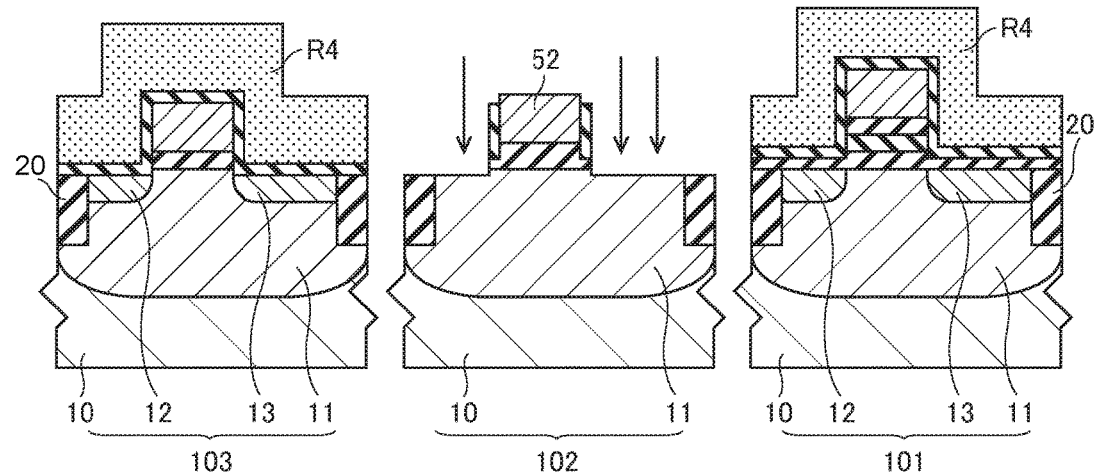
FIG. 19 is a cross-sectional view showing an eighteenth step of the semiconductor device production method according to an embodiment of the invention.
Figure 20:
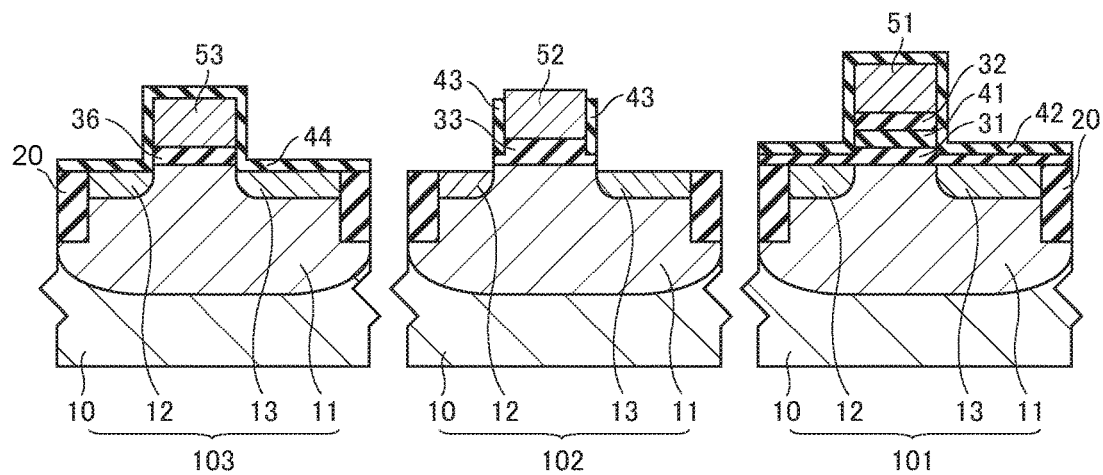
FIG. 20 is a cross-sectional view showing a nineteenth step of the semiconductor device production method according to an embodiment of the invention.

Next, in an eighteenth step shown in FIG. 19 and a nineteenth step shown in FIG. 20, impurity regions 12 and 13 are formed in the second region 102 of the semiconductor substrate 10, the impurity regions 12 and 13 serving as source and drain extension regions for a high-breakdown voltage MOS transistor.

Figure 17:
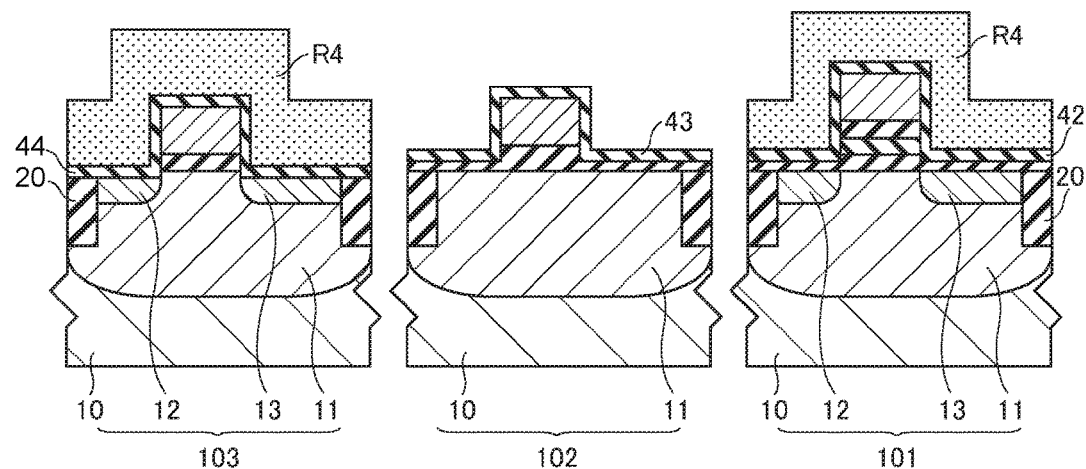
FIG. 17 is a cross-sectional view showing a sixteenth step of the semiconductor device production method according to an embodiment of the invention.

That is, as shown in FIG. 19, a dopant (for example, impurity ions such as arsenic or phosphorus) that is necessary to form the impurity regions 12 and 13 in the second region 102 is implanted into the second region 102 of the semiconductor substrate 10 by using the resist pattern layer R4 formed in the sixteenth step shown in FIG. 17 and the second gate electrode 52 as a mask. As a result, as shown in FIG. 20, impurity regions 12 and 13 are formed in the second region 102 of the semiconductor substrate 10 next to the second gate electrode 52 as viewed in plan view. After that, the resist pattern layer R4 is removed through a cleaning treatment.

By doing so, the resist pattern layer R4 used as a mask for etching the third silicon nitride film 43 can be used as a mask for implanting a dopant into the second region 102 of the semiconductor substrate 10. Accordingly, a semiconductor device according to the present embodiment can be produced without adding an additional photolithography step to a conventional semiconductor device production process.

Formation of Side Wall 2

Figure 21:
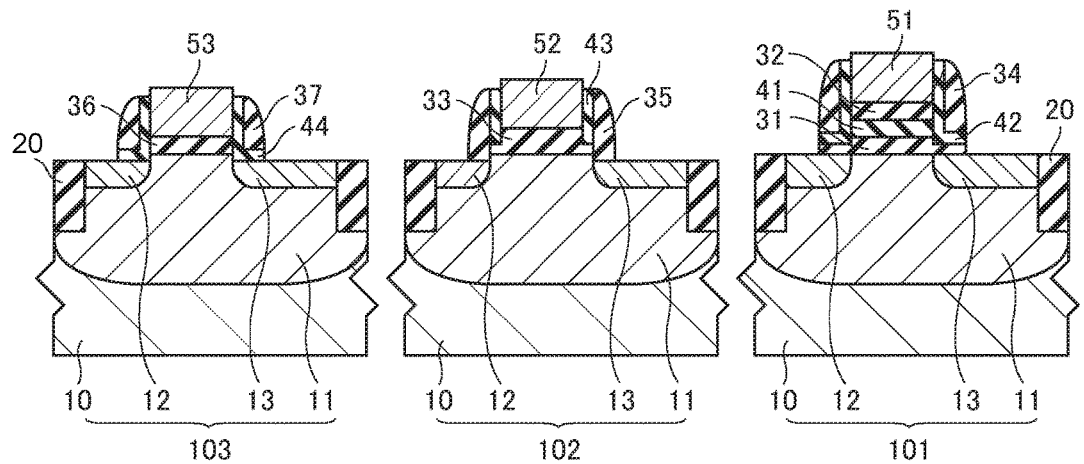
FIG. 21 is a cross-sectional view showing a twentieth step of the semiconductor device production method according to an embodiment of the invention.

Next, in a twentieth step shown in FIG. 21, a fourth silicon oxide film 34 is formed on the second silicon nitride film 42 in the first region 101, a fifth silicon oxide film 35 is formed on the second region 102 of the semiconductor substrate 10, and a seventh silicon oxide film 37 is formed on the fourth silicon nitride film 44 in the third region 103. It is desirable that the fifth silicon oxide film 35 has a thickness greater than the thickness of the first silicon oxide film 31. Furthermore, it is desirable that the fifth silicon oxide film 35 has a thickness substantially equal to the thickness of the fourth silicon oxide film 34.

To be specific, a silicon oxide film is formed, by for example, a CVD method, on the second silicon nitride film 42 of the first region 101, the second region 102 of the semiconductor substrate 10, and the fourth silicon nitride film 44 of the third region 103. After that, the semiconductor substrate 10 having the silicon oxide film formed thereon is dry etched so as to remove a portion of the silicon oxide film, a portion of the second silicon nitride film 42, and a portion of the fourth silicon nitride film 44. As a result, side walls as shown in FIG. 21 are formed in the transistors.

Formation of Source and Drain

Next, a dopant (for example, impurity ions such as arsenic or phosphorus) is implanted into the first to third regions 101 to 103 of the semiconductor substrate 10 by using the first to third gate electrodes 51 to 53 and the side walls as a mask. As a result, as shown in FIG. 1, impurity regions 14 and 15 are formed in the first region 101 of the semiconductor substrate 10 next to the first gate electrode 51 and the side walls as viewed in plan view. Also, impurity regions 14 and 15 are formed in the second region 102 of the semiconductor substrate 10 next to the second gate electrode 52 and the side walls as viewed in plan view. Furthermore, impurity regions 14 and 15 are formed in the third region 103 of the semiconductor substrate 10 next to the third gate electrode 53 and the side walls as viewed in plan view.

For example, the impurity region 14 is formed by ion implanting, deeply into the well region 11 and the impurity region 12, a dopant of the same type as the dopant used in the impurity region 12 in the same dose as that used in the impurity region 12. Likewise, the impurity region 15 is formed by ion implanting, deeply into the well region 11 and the impurity region 13, a dopant of the same type as the dopant used in the impurity region 13 in the same dose as that used in the impurity region 13. The impurity regions 14 and 15 may be formed in the same step. Furthermore, a metal silicide layer may be formed on the impurity regions 14 and 15.

Also, as shown in FIG. 1, a fifth silicon nitride film 45 may be formed on the semiconductor substrate 10 where the transistors Q1 to Q3 have been formed. As a result of a fifth silicon nitride film 45 that is in contact with the second silicon nitride film 42 being formed at least on the memory transistor Q1, the electric charges trapped in the first silicon nitride film 41 of the memory transistor by process charging can be also diffused into the fifth silicon nitride film 45 via the second silicon nitride film 42, and thus the influence of process charging on the threshold voltage of the memory transistor Q1 can be further reduced.

Interconnect

After that, an interlayer insulating film 60 having openings at predetermined positions is formed on the semiconductor substrate 10 where the transistors Q1 to Q3 have been formed. Also, plugs 71 to 73 made of tungsten (W) or the like are formed within the openings of the interlayer insulating film 60, and connected to the first to third gate electrodes 51 to 53, respectively. Furthermore, interconnects 81 to 83 that are made of aluminum (Al) or the like and connected to the plugs 71 to 73 are formed. Likewise, interconnects are also connected to the sources and the drains of the transistors Q1 to Q3 via plugs (not shown). In this way, a predetermined number of interlayer insulating films and interconnect layers are formed as needed.

In the semiconductor device production method according to the present embodiment, the memory transistor Q1 that includes the first gate electrode 51 on an ONO structure including the first silicon nitride film 41 and in which the electric charges trapped in the first silicon nitride film 41 by process charging can be diffused into the semiconductor substrate 10 and the like via the second silicon nitride film 42 constituting the side walls and the MOS transistor Q2 that includes the second gate electrode 52 on the third silicon oxide film 33 and in which at least a portion of the third silicon nitride film 43 constituting the side walls is removed, and thus a parasitic memory cell is unlikely to be formed are simultaneously formed on the same semiconductor substrate 10. Accordingly, it is possible to produce a semiconductor device in which the influence of process charging on the threshold voltage of the memory transistor Q1 is reduced and also characteristic variations caused by a parasitic memory cell being formed in the side walls of the MOS transistor Q2 are suppressed.

Also, the second MOS transistor Q3 that includes the third gate electrode 53 on the sixth silicon oxide film 36 and in which the fourth silicon nitride film 44 constituting the side walls is disposed directly on the semiconductor substrate 10, and thus a parasitic memory cell is unlikely to be formed can be formed on the same semiconductor substrate 10 simultaneously with the memory transistor Q1 and the MOS transistor Q2.

The invention is not limited to the embodiments given above, and a person having ordinary skill in the art can make many modifications within the technical concept of the invention.

What is claimed is:

1. A semiconductor device comprising:
   a semiconductor substrate;
   a memory transistor including a first silicon oxide film, a first silicon nitride film, a second silicon oxide film, and a first gate electrode that are disposed in sequence on the semiconductor substrate; and
   a MOS transistor including a third silicon oxide film and a second gate electrode that are disposed in sequence on the semiconductor substrate,
   wherein the memory transistor has a side wall including an extending portion of the first silicon oxide film, a second silicon nitride film that is in contact with the first silicon nitride film, and a fourth silicon oxide film that are disposed in sequence on the semiconductor substrate,
   the MOS transistor has a side wall including a fifth silicon oxide film that is disposed on the semiconductor substrate, and
   the fifth silicon oxide film has a thickness greater than a thickness of the first silicon oxide film.

2. The semiconductor device according to claim 1, wherein the fifth silicon oxide film has a thickness substantially equal to a thickness of the fourth silicon oxide film.

3. The semiconductor device according to claim 1, wherein the side wall of the MOS transistor further includes a third silicon nitride film that is in contact with a side surface of the second gate electrode and a side surface of the third silicon oxide film.

4. The semiconductor device according to claim 1, further comprising
   a second MOS transistor including a sixth silicon oxide film and a third gate electrode that are disposed in sequence on the semiconductor substrate,
   wherein the second MOS transistor has a side wall including a fourth silicon nitride film and a seventh silicon oxide film that are disposed in sequence on the semiconductor substrate.

5. The semiconductor device according to claim 4, wherein the fourth silicon nitride film has a thickness substantially equal to a thickness of the second silicon nitride film.

6. The semiconductor device according to claim 4, wherein a voltage applied to the MOS transistor is higher than a voltage applied to the second MOS transistor.

7. The semiconductor device according to claim 1, wherein a fifth silicon nitride film that is in contact with the second silicon nitride film is disposed at least on the memory transistor.

8. A semiconductor device production method comprising:
   (a) forming a first silicon oxide film, a first silicon nitride film, and a second silicon oxide film in sequence on a first region of a semiconductor substrate;
   (b) forming a third silicon oxide film on a second region of the semiconductor substrate;
   (c) forming a conductive film on the second and third silicon oxide films;
   (d) forming a first gate electrode on the second silicon oxide film and also forming a second gate electrode on the third silicon oxide film by patterning the conductive film;
   (e) partially removing the first to third silicon oxide films and the first silicon nitride film by using the first and second gate electrodes as a mask such that a portion of the first silicon oxide film is left around the first gate electrode as viewed in plan view;
   (f) forming a second silicon nitride film on the first silicon oxide film and the first gate electrode so as to be in contact with the first silicon nitride film and also forming a third silicon nitride film on the second gate electrode;
   (g) removing at least a portion of the third silicon nitride film; and
   (h) forming a fourth silicon oxide film on the second silicon nitride film and also forming a fifth silicon oxide film on the second region of the semiconductor substrate,
   wherein the fifth silicon oxide film has a thickness greater than a thickness of the first silicon oxide film.

9. The production method according to claim 8, wherein the step (g) includes forming a resist pattern layer at least on the second silicon nitride film and etching the third silicon nitride film by using the resist pattern layer as a mask, and
   the production method further includes implanting an impurity into the second region of the semiconductor substrate by using at least the resist pattern layer and the second gate electrode as a mask, which is performed between the step (g) and the step (h).

10. The production method according to claim 8,
wherein the step (g) includes removing a portion of the third silicon nitride film such that the third silicon nitride film that is in contact with a side surface of the second gate electrode and a side surface of the third silicon oxide film is left.

11. The production method according to claim 8,
wherein the step (g) includes entirely removing the third silicon nitride film.

12. The production method according to claim 8, further comprising
forming a sixth silicon oxide film on a third region of the semiconductor substrate,
wherein the step (c) includes forming a conductive film on the sixth silicon oxide film,
the step (d) includes forming a third gate electrode on the sixth silicon oxide film by patterning the conductive film,
the step (e) includes removing the sixth silicon oxide film by using the third gate electrode as a mask such that the sixth silicon oxide film is not left around the third gate electrode as viewed in plan view,
the step (f) includes forming a fourth silicon nitride film on the semiconductor substrate and the third gate electrode, and
the step (h) includes forming a seventh silicon oxide film on the fourth silicon nitride film.

13. The production method according to claim 8, further comprising
forming a fifth silicon nitride film that is in contact with the second silicon nitride film at least on the memory transistor.

14. The production method according to claim 8,
wherein the step (g) includes removing a portion of the second region of the semiconductor substrate, or the step (e) includes removing a portion of a third region of the semiconductor substrate.

* * * * *